United States Patent
Kramer et al.

(10) Patent No.: US 6,291,836 B1
(45) Date of Patent: *Sep. 18, 2001

(54) METHOD OF OPERATING A PROGRAMMABLE, NON-VOLATILE MEMORY DEVICE

(75) Inventors: Niels Kramer; Maarten J. H. Niesten; Wilhelmus H. M. Lodders; Gerrit Oversluizen, all of Eindhoven (NL)

(73) Assignee: U. S. Philips Corporation, New York, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/866,649

(22) Filed: May 30, 1997

(30) Foreign Application Priority Data

Jun. 5, 1996 (EP) .................................. 96201571

(51) Int. Cl.⁷ .................. H01L 21/8246; H01L 21/8247
(52) U.S. Cl. ............................................. 257/50; 257/209
(58) Field of Search .................................. 257/208, 209, 257/50, 49

(56) References Cited

U.S. PATENT DOCUMENTS

| | | | |
|---|---|---|---|
| 3,530,441 | * 9/1970 | Ovshinsky | 257/65 |
| 4,442,507 | * 4/1984 | Roesner | 365/100 |
| 4,597,162 | * 7/1986 | Johnson et al. | 29/574 |
| 4,599,705 | * 7/1986 | Holmberg et al. | 365/163 |
| 4,868,616 | * 9/1989 | Johnson et al. | 357/17 |
| 5,404,007 | * 4/1995 | Hotaling | 250/216 |
| 5,502,315 | * 3/1996 | Chua et al. | 257/50 |
| 5,835,396 | * 11/1998 | Zhang | 365/51 |
| 5,973,335 | * 10/1999 | Shannon | 257/49 |

FOREIGN PATENT DOCUMENTS

WO 90/13921 * 11/1990 (WO).

OTHER PUBLICATIONS

"Resistless High Resolution Optical Lithography on Silicon", by N. Kramer et al, 1995 American Institute of Physics, Appl. Phys. Lett. 67 (20), Nov. 13, 1995, pp. 2989–2991.

* cited by examiner

Primary Examiner—Eddie Lee
Assistant Examiner—Bradley Wm. Baumeister
(74) Attorney, Agent, or Firm—Steven R. Biren

(57) ABSTRACT

The invention relates to an erasable non-volatile memory in which a diode is formed at each point of intersection between the x-selection lines ($K_i$) and y-selection lines ($R_j$), of which diode the anode and cathode are conductively connected to the x- and y-selection lines. The diodes are formed in hydrogenated amorphous silicon or silicon compounds such as amorphous $S_{i-x}Ge_x$. Writing takes place by means of a current pulse through selected diodes. The current in the forward direction becomes much lower, for example a few hundred times lower, than in diodes which are not selected, probably owing to degradation in the semiconductor material. The diodes may be returned to their original state again (i.e. be erased) through heating, for example at a temperature of 200° C. during 100 minutes. Preferably, the diodes are formed by Schottky diodes because the characteristic in the reverse direction does not (substantially) change in this type of diode. The Schottky diodes may be formed in the transitional region between the amorphous intrinsic semiconductor material (6) and the selection lines ($K_i$).

1 Claim, 3 Drawing Sheets

METHOD OF OPERATING A PROGRAMMABLE, NON-VOLATILE MEMORY DEVICE

BACKGROUND OF THE INVENTION

The invention relates to a programmable, non-volatile memory device (PROM), comprising a system of programmable non-volatile memory cells arranged in a matrix of rows and columns and provided with a first set of selection lines parallel to the columns and with a second set of selection lines parallel to the rows, a memory cell being associated with each point of intersection between the selection lines. The invention also relates to a method of manufacturing such a device.

Programmable semiconductor memories or PROMs are known in various shapes. One of the earliest PROM types made use of fuses, where programming of a selected cell implies that the connection between a word line and a bit lines is broken in that the fuse is melted. These memories may be readily manufactured by generally known i.c. techniques, but they have the disadvantage that information once written cannot be erased any more. This means that a new chip is to be used for writing new data. In addition, the cells themselves cannot be tested during production and it is necessary to provide extra test cells on the chip which cannot be utilized for the memory. Another type of programmable memories is known under names such as EEPROM, EPROM, Flash EPROM. Each memory cell here comprises an MOS transistor with floating gate. The information is written in the form of electric charge at the floating gate and thus determines the threshold voltage of the transistor. These memories are erasable in principle, which means that separate test cells are unnecessary. A disadvantage is that the memory cells are comparatively large, which renders it difficult to manufacture memories with a very large number of bits. A third type of programmable memories, also erasable, is based on a resistance change in materials upon the transition between the crystalline and the non-crystalline state. Such memories are known inter alia under the abbreviated designation MIM (Metal-Insulator-Metal). These memories require for each cell besides the MIM element also a selection element such as a transistor or a diode. In addition, a chalcogenide material which does not form part of standard silicon processes is often used for the switchable element.

SUMMARY OF THE INVENTION

The invention has for its object inter alia to provide a programmable semiconductor memory which is erasable and which has a very high density. The invention further has for its object to provide such a memory which can be manufactured by silicon techniques which are known per se.

A programmable non-volatile memory device of the kind described in the opening paragraph, according to the invention, is characterized in that each memory cell is exclusively formed by a diode whose anode and cathode are each conductively connected to a selection line, at least one of the anode and cathode regions comprising a layer of hydrogenated, silicon-containing amorphous semiconductor material. Experiments have shown that it is possible, for example in a rectifying junction in hydrogenated amorphous silicon, for the current to be changed in the forward direction in that a large current is passed across the junction during a short time. The current in the forward direction is found to be very strongly reduced then compared with a non-stressed diode. It is not clear at this moment what the physical background of this effect is. Probably degradation occurs in the material owing to the generation of additional states within the forbidden band. These states can be eliminated again through heating. Each diode in a matrix of diodes may or may not be programmed by means of current, depending on the information to be written, corresponding to a "1" or a "0". In contrast to a fuse memory, no separate selection element is necessary now for each cell. In addition, each diode can be returned to its original state again through a heating step in which the degradation in the semiconductor material is eliminated. This renders it possible to test each cell itself after production, and separate test cells are unnecessary.

An important embodiment of a device according to the invention with which a memory of maximum density can be obtained is characterized in that the layer of semiconductor material forms a stack with the selection lines at the area of the intersection between the selection lines and is connected at the upper side to one of the selection lines and at the lower side to the other selection line which crosses the former selection line.

In a simple embodiment, the diode is formed by a p-i-n diode, the letter i denoting "intrinsic" here, which means in practice a semiconductor material which is not purposely n-type or p-type doped. Materials may be used for the conductor tracks here which form an ohmic connection with the n-type and p-type zones of the p-i-n diodes.

A further embodiment of a device according to the invention is characterized in that at least one of the selection lines is formed by a metal track, and in that the diode is a Schottky diode arranged between this metal track and the layer of semiconductor material. It was found in practice that a Schottky diode has the advantage that mainly the forward characteristic of the diode changes, whereas the current in the reverse direction does not change, or only slightly, which has advantages in reading. It is possible to use for the metal track, for example, a metal from the group: Mo, W, TiW, Pt, and Cr., which form good rectifying junctions with intrinsic αSi:H.

Various hydrogenated Si compounds may be taken for the amorphous semiconductor material, such as SiGe, SiC, or SiN. A simple embodiment is characterized in that the layer of semiconductor material is formed by a layer of hydrogenated amorphous silicon.

The properties of the amorphous semiconductor material, and thus of the diode to be formed, depend strongly on the circumstances under which the material is formed, in particular on the degree to which the dangling bonds are bound to hydrogen. According to the invention, a method of manufacturing a device of the kind described above is characterized in that the layer of amorphous semiconductor material is formed by means of PECVD (Plasma Enhanced CVD) at a temperature of at most 400° C., and preferably at a temperature of at most approximately 250° C. It was found that a suitable semiconductor material with a high concentration of hydrogen atoms bound to dangling bonds can be manufactured in this manner.

BRIEF DESCRIPTION OF THE DRAWING

These and other aspects of the invention will be explained in more detail below with reference to several embodiments. In the drawing.

DESCRIPTION OF THE PREFERRED EMBODIMENTS

Figure 1:
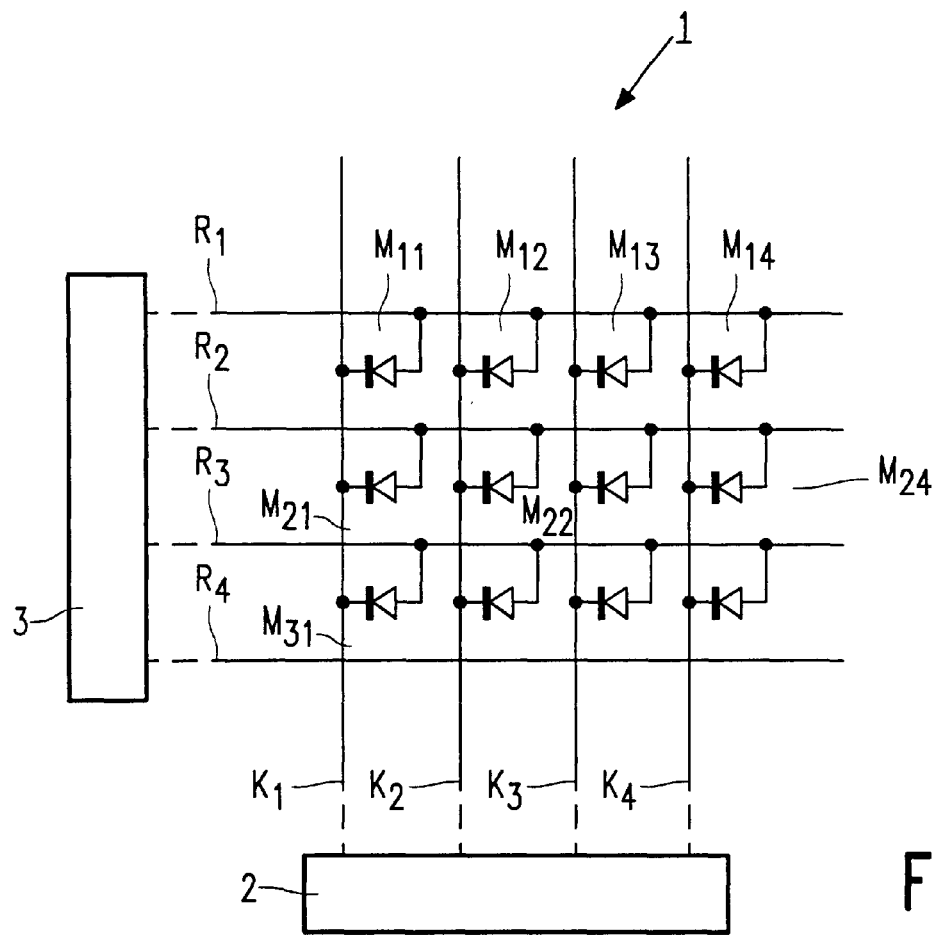
FIG. 1 is a circuit diagram of an erasable PROM according to the invention.

FIG. 1 represents the circuit diagram of a programmable semiconductor memory I according to the invention, comprising a matrix of programmable non-volatile memory cells $M_{ij}$, where i represents the row and j the column in the matrix. The device comprises a first set of selection lines $K_1$, $K_2$, $K_3$, etc., which are connected to a column decoder 2, and a second set of selection lines $R_1$, $R_2$, $R_3$, which are connected to a row decoder 3. The lines $K_i$ and $R_i$ form a system of crossing rods in which a memory element is associated with each point of intersection and can be addressed via selected lines.

Figure 2:
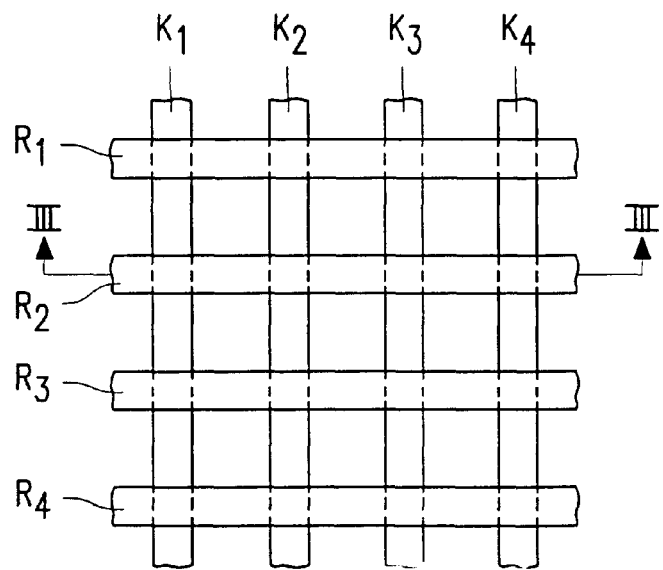
FIG. 2 is a plan view of a portion of this memory.

According to the invention, each memory cell $M_{ij}$ is exclusively formed by a diode whose anode is connected to a row selection line $R_i$ and whose cathode is connected to a column selection line $K_j$, while at least one of the anode and cathode regions comprises hydrogenated, silicon-containing amorphous semiconductor material. In the present example, the diodes are formed by metal-semiconductor junctions or Schottky diodes between one of the selection lines and the layer of amorphous semiconductor material. FIG. 2 is a plan view of a portion of the memory. The vertical selection lines $K_j$ are provided in a lower metal layer. The selection lines $R_j$ are formed in a higher, wiring layer. The amorphous silicon forming the programmable diode in each point of intersection is provided between the selection lines and forms a vertical stack together with these lines in this embodiment.

Figure 3A:
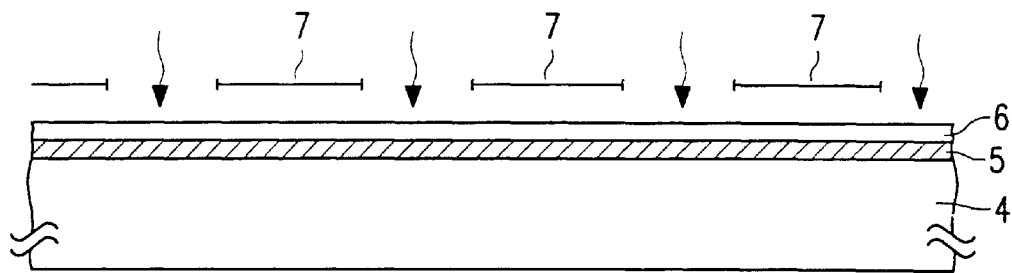
FIGS. 3a–3c show two steps in the manufacture of the memory shown in FIGS. 1 and 2.
Figure 3B:
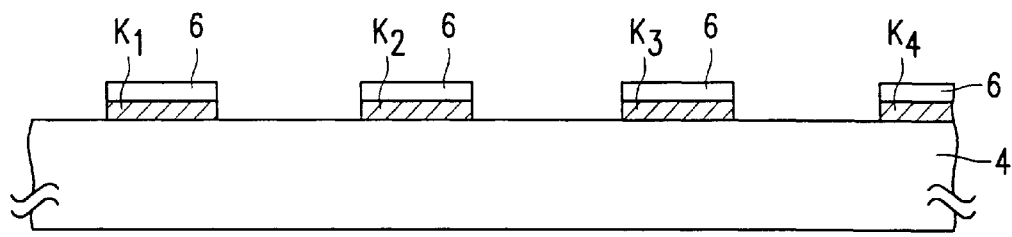
Figure 3C:
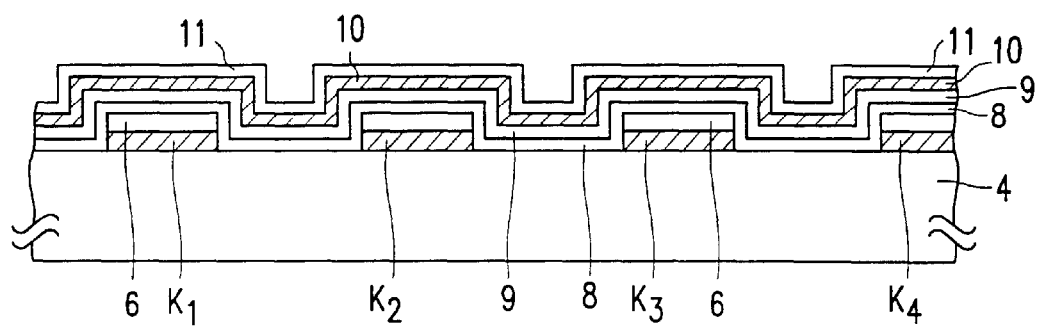

FIGS. 3a, 3b and 3c show the device in a cross-section taken on the line III—III in FIG. 2 in three stages of its manufacture. This starts (FIG. 3a) with a substrate 4, made of glass in this example, but which may also be made from an alternative electrically insulating material. The substrate may also be formed by a silicon oxide layer which covers a subjacent monocrystalline silicon body, in which the peripheral electronics, for example the decoders 2 and 3, may be provided, if so desired. A layer 5 of a suitable metal, for example Mo, with a thickness of approximately 100 nm is first formed on the surface of the substrate 4, followed by a deposition of a 100 nm thick layer 6 of amorphous silicon doped with hydrogen. Preferably, the layer 6 is deposited by means of PECVD (Plasma Enhanced CVD) at a low temperature (maximum 400° C., preferably between 200° C. and 250° C.), for example from a mixture of $SiH_4$ and $H_2$. Owing to the low temperature, a comparatively high concentration of hydrogen can be obtained as is necessary for passivating the dangling bonds. Otherwise the Si material of the layer 6 is intrinsic, i.e. the concentration of n-type or p-type impurities has a low level which occurs naturally and is not purposely raised by means of a doping step. As a result, the Mo forms a rectifying junction with the Si.

The layer 6 is not essential and may be omitted when conventional lithography is used.

The αSi layer 6 is locally oxidized, for example in the manner as described in the article "Resistless high resolution optical lithography on silicon" by N. Kramer et al., published in Appl. Phys. Lett. 67 (20), Nov. 13, 1995, pp. 2989/2991. In this method, the layer 6 is locally irradiated with UV (λ=355 nm) in the air through openings in a shadow mask 7 defining the selection lines $K_j$. The αSi:H is oxidized through at least part of its thickness at the areas of the openings, whereby an oxide layer is formed which masks the subjacent portion of the Si against etching. The non-irradiated portion of the layer 6 is subsequently removed by etching; then the portions of the Mo layer 5 not covered by Si and the oxide layer on the remaining αSi of the layer 6 are also removed, so that the situation depicted in FIG. 3b is obtained, with the selection lines $K_i$ being covered by lanes 6 of αSi:H. In a next step, a layer 8 of intrinsic amorphous silicon is first provided to a thickness of, for example, 400 nm, followed by a deposition of a layer 9 of n-type doped amorphous silicon with a thickness of, for example, 75 nm. The layers 8 and 9 are also doped with hydrogen and may be provided in the same manner as the layer 6. The n-type doping in the layer 9 may be provided during the deposition in that phosphine is added to the plasma. Then a second metal layer 10, in this example another Mo layer with a thickness of 75 nm, is provided, so as to form an ohmic junction with the—doped—Si of the layer 9. Finally a fourth layer 11 of αSi:H of approximately 75 nm is deposited. The selection lines $R_i$ are defined in a manner analogous to that of the lines K in that the αSi layer 11 is locally oxidized at the areas of the lines R by means of UV radiation, whereupon the non-irradiated αSi of the layer 11 is removed by etching. The Mo layer is now brought into a pattern with the pattern thus obtained in the layer 11 acting as a mask, whereby the selection lines $R_i$ are formed. Subsequently, the amorphous silicon of the layers 8 and 9 not covered by the remaining Mo of the layer 10 is removed, simultaneously with which the layer 11 can be removed. This in fact completes the memory matrix. The diodes are situated at the points of intersection between the lines K and the lines R, whereby a very compact configuration can be obtained.

Figure 4:
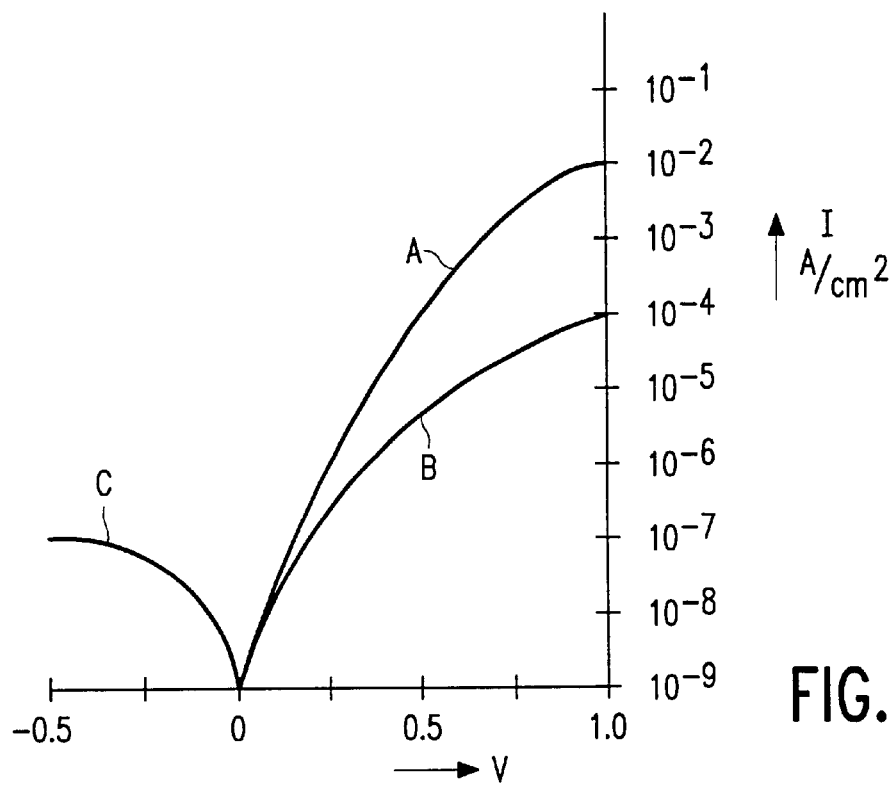
FIG. 4 shows I–V characteristics of a memory cell in the programmed and non-programmed state.
Figure 5:
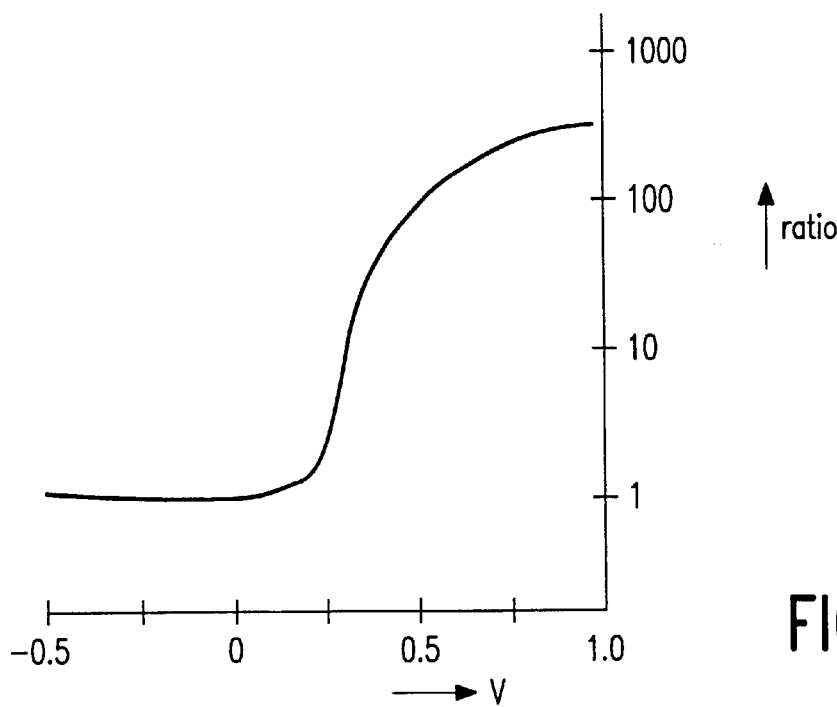
FIG. 5 shows the current in a programmed and a non-programmed diode as a function of the voltage.

FIG. 4 plots the current I in amps on the vertical axis as a function of the voltage V applied across a diode. Curve A represents the current of a non-programmed diode, with the voltage applied in the forward direction. This state may be regarded as a logic "0". When a very strong current is passed through the diode, degradation will occur in the intrinsic Si, as a result of which the current I becomes much lower in the case of a forward bias, i.e. curve B in FIG. 4. A specific value for this current is, for example, $1A/cm^2$. The current value may be chosen within certain limits, for example in view of the programming speed. Thus a stronger current may be chosen when the writing speed must be high. Given a voltage of 1 V, the difference in the forward current may be a factor 400, which may be used as a logic "1". The degradation is probably caused by the generation of defects in the intrinsic Si layer, which defects can be eliminated again through heating. It was found that heating to, for example, 200° C. for 100 minutes causes the diode to exhibit substantially the I–V characteristic A again. This effect can be utilized for erasing the memory. Curve C in FIG. 4 shows the I–V characteristic of a diode in the reverse bias state. This characteristic does not change substantially in the case of programming and/or erasing. FIG. 5 shows the ratio between the current through the diode in the programmed state and the current in the non-programmed state. As is evident from the drawing, this ratio depends strongly on the voltage and is of the order of 100 for a voltage of 1 V. The ratio is practically equal to 1 in the reverse bias state.

The memory may be tested after its manufacture in that each cell is programmed and subsequently the memory is erased in the manner described above. Separate test cells are accordingly not necessary. In addition, it has important advantages for the reliability that the memory cells themselves can be tested. The diodes can be monitored during writing, the procedure being stopped when the current through the diode has been sufficiently reduced.

Figure 6:
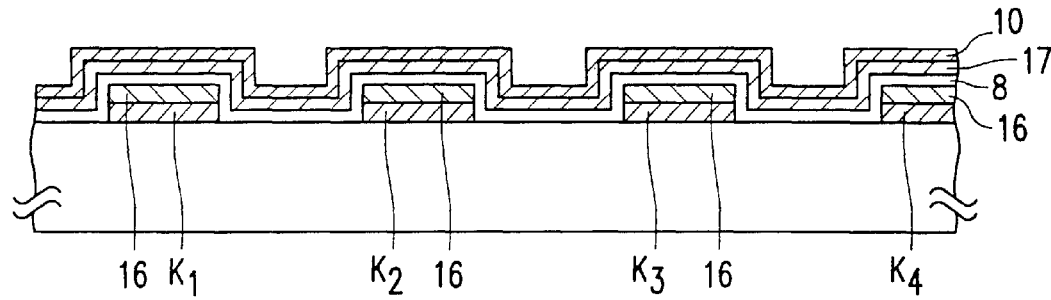
FIG. 6 is a cross-section of an alternative embodiment of a device according to the invention.

FIG. 6 is a cross-section of an embodiment of a non-volatile erasable programmable memory according to the invention in which the diodes are formed by p-i-n junctions in αSi:H. Corresponding components have been given the same reference numerals in FIG. 6 as in FIG. 3c for simplicity's sake. The memory matrix is provided on a substrate 3 again and comprises the column lines $K_1, K_2, K_3$, etc., which extend transversely to the plane of drawing over the substrate. These lines, for example made of Mo again, are covered with strip-shaped lanes of hydrogen-doped αSi which has been n-type or p-type doped with a suitable impurity. In this example, the lanes 16 are of the n-type and are doped with As or P atoms in a sufficiently high concentration such that the Mo lines K form conductive junctions with the amorphous Si lanes 16. The Mo lanes and the amorphous Si lanes 16 may be patterned in the same manner as the Mo lanes K and the amorphous Si lanes 6 in the preceding embodiment. The selection lines $R_1$ are formed by Mo lanes 10, of which one is shown in the drawing. A lane 17 of p-type doped αSi:H is present below the Mo lane 10, forming an ohmic junction with the Mo of the lane 10. The amorphous p-type lane 17 is separated from the amorphous n-type lanes 16 by an interposed strip 8 of amorphous intrinsic (not purposely n-type or p-type doped) Si. The layers, 10, 17 and 8 may be formed in the same manner as the layers 10, 9 and 8 in the preceding embodiment. In the matrix shown in FIG. 6, a p-i-n diode is formed at each point of intersection between the lines $K_i$ and the lines $R_j$ (Mo lanes 10).

Writing and erasing of the memory of FIG. 6 may be effected in the manner as described with reference to the preceding embodiment.

It will be obvious that the invention is not limited to the embodiments described here but that many more variations are possible to those skilled in the art within the scope of the invention. Thus, instead of amorphous silicon, amorphous SiGe may be used, i.e. wherein part of the Si atoms are replaced by Ge atoms. Furthermore, suitable metals other than Mo may be used for the selection lines. A monocrystalline Si substrate may be used as the substrate 3, possibly provided with an integrated circuit comprising, for example, the necessary peripheral electronics for operating the memory. Furthermore, memories as described above may be stacked on top of one another in a multilayer structure, planarization layers being provided between the individual layers.

What is claimed is:

1. A method of operating a programmable, non-volatile memory device (PROM) comprising a system of programmable non-volatile memory cells arranged in a matrix of rows and columns and provided with a first set of selection lines parallel to the columns and with a second set of selection lines parallel to the rows, a memory cell being associated with each point of intersection between the selection lines, wherein each memory cell consists of only a single-element cell exclusively formed by a diode whose anode and cathode are each conductively connected to a selection line of a different set, at least one of the anode and cathode regions comprising a layer of hydrogenated, silicon-containing amorphous semiconductor material, each memory cell being operated by repeatably bringing said memory cell to a resettable lower conductivity state in response to a current pulse and repeatably bringing said memory cell to a resettable higher conductivity state in response to a heat application.

\* \* \* \* \*